United States Patent [19]
Ihara

[11] Patent Number: 5,175,451
[45] Date of Patent: Dec. 29, 1992

[54] BIASING CIRCUIT FOR SENSE AMPLIFIER

[75] Inventor: Makoto Ihara, Sakurai, Japan

[73] Assignee: Sharp Kabushiki Kaisha, Osaka, Japan

[21] Appl. No.: 772,914

[22] Filed: Oct. 8, 1991

[30] Foreign Application Priority Data

Oct. 8, 1990 [JP] Japan .................. 2-270954
Oct. 8, 1990 [JP] Japan .................. 2-270955

[51] Int. Cl.$^5$ .......................... H03F 3/45; H03K 5/22
[52] U.S. Cl. .................... 307/530; 307/355; 307/359; 307/362; 365/189.06; 365/189.11; 365/205; 365/208
[58] Field of Search ............... 307/530, 355, 359, 362, 307/550; 365/190, 205, 207, 208, 189.06, 189.11

[56] References Cited

U.S. PATENT DOCUMENTS

| 4,453,092 | 6/1984 | Joseph ................... | 307/355 |
| 4,692,642 | 9/1987 | Fukuzo et al. .......... | 307/355 |
| 4,775,808 | 10/1988 | Trumpp ................. | 307/359 |
| 4,910,455 | 3/1990 | Nadd ..................... | 307/359 |

FOREIGN PATENT DOCUMENTS 1170420 7/1985 U.S.S.R. .

OTHER PUBLICATIONS

E. Kume et al., "Experiment on Multi-Phase Driving of Sense Amplifiers" Spring National Conference on the Institute of Electronics, Information and Communication Engineers, (1988) p. 2-289.

T. Yabe et al., "Drivability Stabilized Output Buffer for LSI with an On-Chip Power Supply" Autumn National Conference of the Institute of Electronics, Information and Communication Engineers, (1990) p. 5-235.

Primary Examiner—William L. Sikes
Assistant Examiner—Margaret Rose Wambach
Attorney, Agent, or Firm—Morrison & Foerster

[57] ABSTRACT

When a common source line of sense amplifiers in a semiconductor memory device is pulled down via a pull-down transistor, a current level signal indicative of the level of the current which flows through the pull-down transistor is generated. The current level signal is compared with a reference level signal indicative of an allowable maximum level of the current which flows through the pull-down transistor. When the current level signal exceeds the allowable maximum level, the pull-down transistor is controlled to reduce the current flowing therethrough.

9 Claims, 13 Drawing Sheets

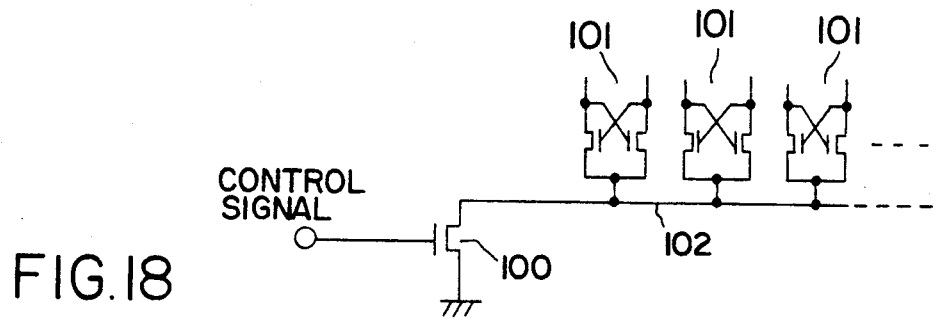
FIG.18
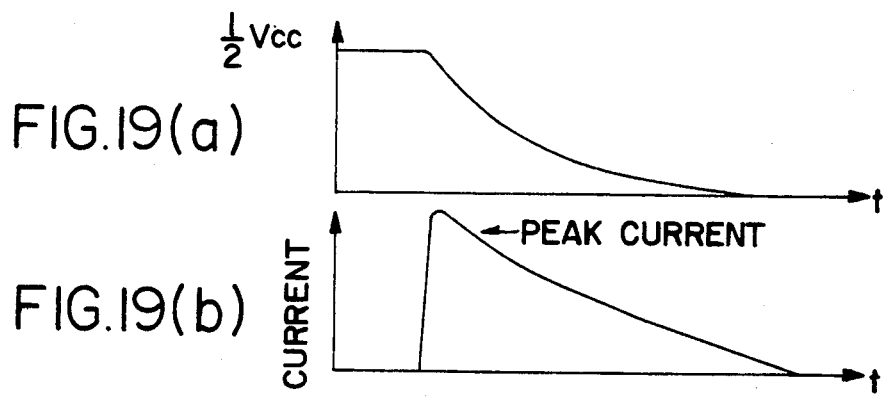
FIG.19(a)
FIG.19(b)
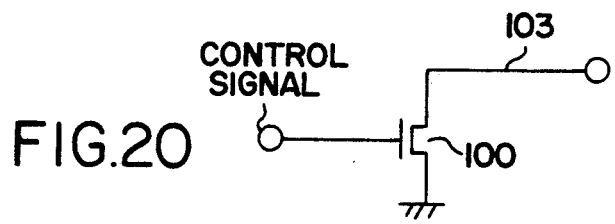
FIG.20

BIASING CIRCUIT FOR SENSE AMPLIFIER

BACKGROUND OF THE INVENTION

1. Field of the Invention

This invention relates to a semiconductor device, and more particularly to a semiconductor device in which a high speed output operation is required.

2. Description of the Prior Art

A typical example of a semiconductor device is a semiconductor memory device such as a DRAM (Dynamic Random Access Memory). FIG. 18 shows NMOS sense amplifiers 101 and a sense amplifier driving transistor 100 used in a DRAM. When the potential at a common source line 102 of the NMOS sense amplifiers 101 is one half (½)Vcc of the supply voltage Vcc, a control signal to drive the NMOS sense amplifiers 101 is supplied to the gate of the sense amplifier driving transistor 100. Then, the sense amplifier driving transistor 100 is turned on to initiate the sense operations of the NMOS sense amplifiers 101.

In such a prior art semiconductor memory device, a peak current flows through the sense amplifier driving transistor 100, as shown in FIG. 19, at the instant of switching on the sense amplifier driving transistor 100, i.e., at the start of the sense operations of the NMOS sense amplifiers 101. When the peak current flows, the potential of the ground to which the sense amplifier driving transistor 100 and other internal circuits are commonly connected rises, thereby causing noises to be generated in such internal circuits.

The sensing sensitivity of a sense amplifier, in general, decreases as the current flowing through the sense amplifier increases, and, therefore, the presence of the peak current also presents the problem of decreasing the sensing sensitivity of the NMOS sense amplifiers 101 at the start of the sense operations. The peak current can be reduced by reducing the size of the sense amplifier driving transistor 100. However, when the size of the sense amplifier driving transistor 100 is reduced, there arises another problem in that the sense operations of the NMOS sense amplifiers 101 take a longer time period to complete.

The above-mentioned problems occur also at the start of an output operation of a semiconductor device in which, as shown in FIG. 20, a line 103 connected to an output of the device is to be pulled down by a pull-down transistor 100.

SUMMARY OF THE INVENTION

The semiconductor device of this invention, which overcomes the above-discussed and numerous other disadvantages and deficiencies of the prior art, comprises pulling means for receiving a control signal, and for pulling the level of a line of said semiconductor device toward a predetermined level in accordance with said control signal, and further comprises: current level signal generation means for generating a current level signal indicative of the level of a current which flows through said pulling means; reference level signal generation means for generating a reference level signal indicative of an allowable maximum level of the current which flows through said pulling means; and comparison means for comparing said current level signal with said reference level signal, and for, when said current level signal exceeds said reference level signal, generating said control signal.

In preferred embodiments, said semiconductor device is a semiconductor memory device having a plurality of sense amplifiers, and said line is a common source line of said sense amplifiers.

In preferred embodiments, said line is a line connected to an output of said semiconductor device.

In preferred embodiments, said semiconductor device further comprises operation period control means for controlling the operation period of at least one of said reference level signal generation means and comparison means.

In preferred embodiments, said pulling means is a pull-down transistor.

In preferred embodiments, said pulling means is a pull-up transistor.

Thus, the invention described herein makes possible the objectives of:

(1) providing a semiconductor device in which the level of a peak current at the start of an output operation can be reduced without increasing the time period required for the output operation; and (2) providing a semiconductor memory device in which the level of a peak current at the start of a sense operation can be reduced without increasing the time period required for the sense operation.

BRIEF DESCRIPTION OF THE DRAWINGS

This invention may be better understood and its numerous objects and advantages will become apparent to those skilled in the art by reference to the accompanying drawings as follows:

FIG. 18 shows a prior art semiconductor device.

FIG. 19 is a timing chart illustrating the operation of the semiconductor device of FIG. 18.

FIG. 20 shows another prior art semiconductor device.

DESCRIPTION OF THE PREFERRED EMBODIMENTS

Figure 1:
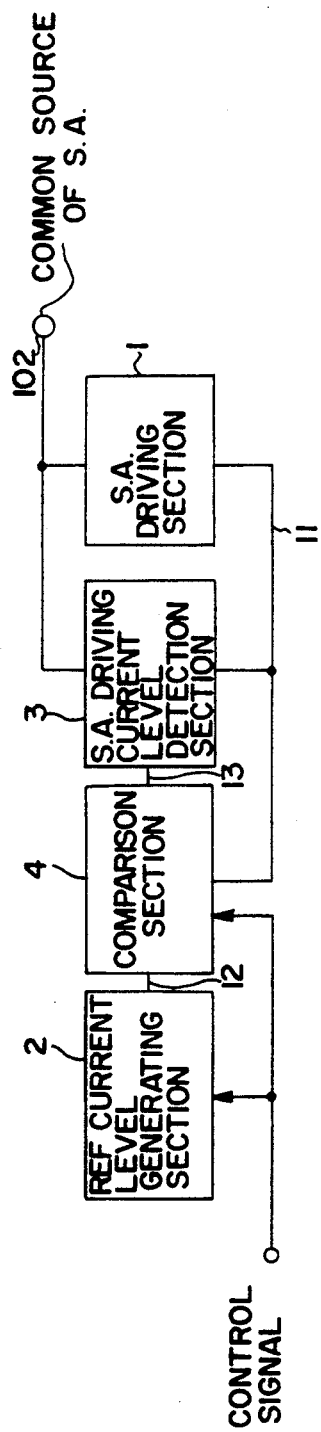
FIG. 1 is a block diagram illustrating a first embodiment of the invention.
Figure 2:
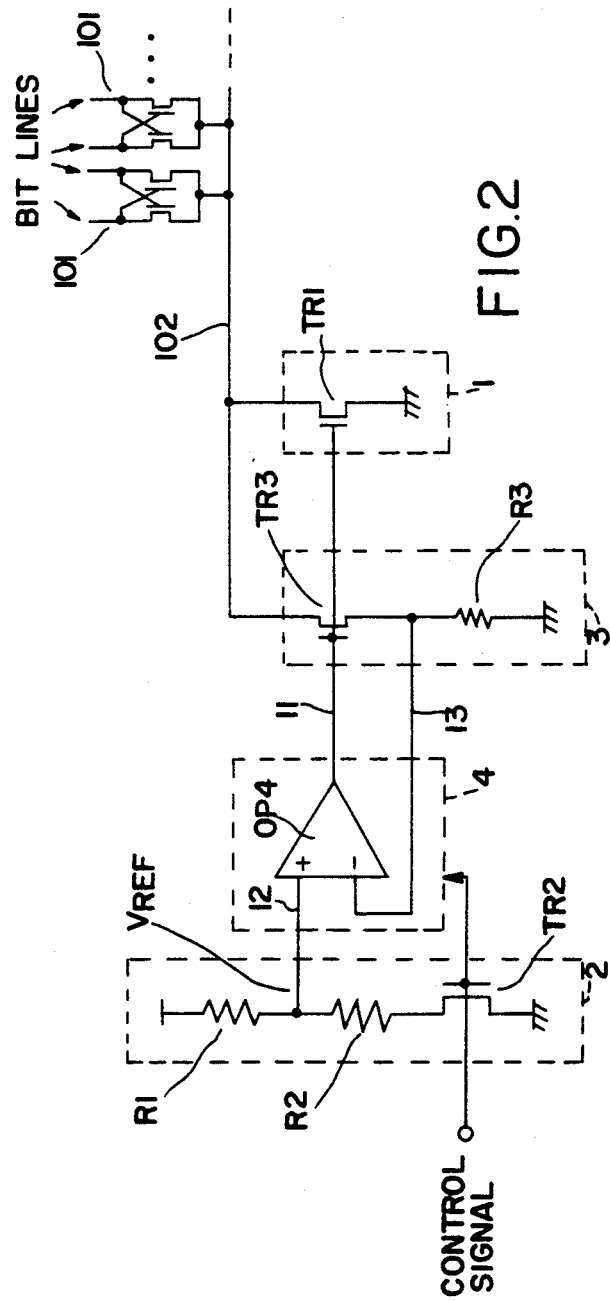
FIG. 2 is a circuit diagram illustrating the first embodiment.
Figure 3A:
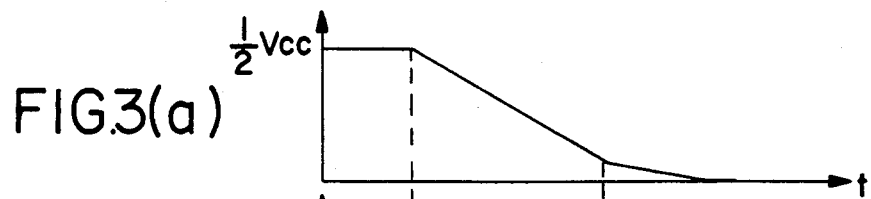
FIG. 3 is a timing chart illustrating the operation of the first embodiment.
Figure 3B:
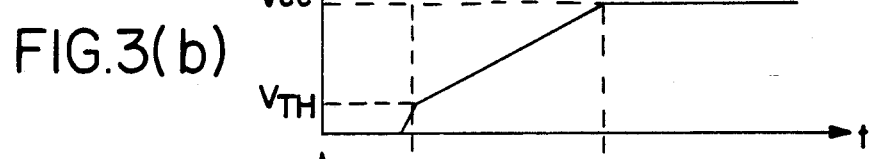
Figure 3C:
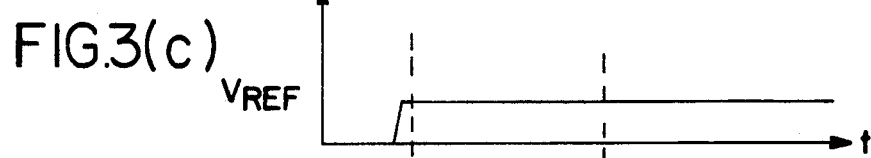
Figure 3D:
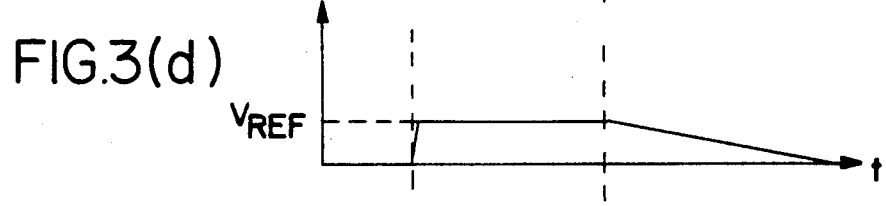
Figure 3E:
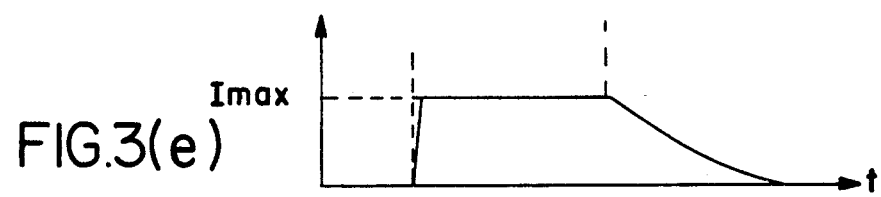

FIG. 1 diagrammatically shows a semiconductor memory device according to the invention. The memory device of the embodiment comprises a sense amplifier driving section 1, a reference current level generating section 2, a sense amplifier driving current level detection section 3, and a comparison section 4. As shown in FIG. 2, the sense amplifier driving section 1 has an NMOS transistor TR1 connected between the common source line 102 of NMOS sense amplifiers 101 and the ground. The reference current level generating section 2 has a series circuit of two resistors R1 and R2 and an NMOS transistor TR2. This series circuit is connected between a voltage source and the ground. The above-mentioned control signal is supplied to the gate of the NMOS transistor TR2. The reference current level generating section 2 divides the supply voltage through the resistors R1 and R2, and the potential of the connecting point of the resistors R1 and R2 is output via a reference current level signal line 12 as a reference voltage $V_{REF}$ or a reference current level signal that sets the upper limit of the current flowing through the sense amplifier driving section 1.

The sense amplifier driving current level detection section 3 has an NMOS transistor TR3 and a resistor R3. The gate of the transistor TR3 is connected to the control terminal (i.e., the gate) of the transistor TR1 in the sense amplifier driving section 1. The transistor TR3 is connected at one end to the common source line 102 and at the other end to the ground via the resistor R3. Therefore, the current flowing through the sense amplifier driving current level detection section 3 is substantially proportional to the current flowing through the sense amplifier driving section 1, if the effect of the voltage drop caused by the resistor R3 is excluded. This means that the sense amplifier driving current level detection section 3 monitors the current flowing through the sense amplifier driving section 1. Thus, the sense amplifier driving current level detection section 3 extracts as the voltage drop across the resistor R3 a sense amplifier driving current level signal which represents the current level proportional to the amount of current flowing through the sense amplifier driving section 1.

The comparison section 4 has an operational amplifier OP4. The reference voltage $V_{REF}$ is coupled to the non-inverting input of the operational amplifier OP4, and the connecting point of the transistor TR3 and the resistor R3 is connected to the inverting input of the operational amplifier OP4. The output of the operational amplifier OP4 is coupled to the gates of the transistors TR3 and TR1 via a control signal line 11.

When the control signal becomes high, the transistor TR2 turns on so that one end of the resistor R2 is connected to the ground and the comparison section 4 is activated. The potential of the reference current level signal line 12 is set to the predetermined reference voltage $V_{REF}$ ((c) of FIG. 3). When the output of the operational amplifier OP4 (i.e., the potential of the signal line 11 ((b) of FIG. 3) exceeds the threshold value $V_{TH}$ of the transistors TR1 and TR3, these transistors turn on, and the sense amplifiers 101 begin to operate and the driving current flows through the transistor TR1 ((e) of FIG. 3). The comparison section 4 controls the potential at the control signal line 11 so that, as shown in FIG. 3, the potential at the driving current level signal line 13 will not exceed the potential $V_{REF}$ on the reference current level signal line 12. Based on the result of a comparison of the sense amplifier driving current level signal with the reference current level signal, the comparison section 4 applies a signal to the gate of the transistor TR1 so as to prevent the amount of the current flowing through the transistor TR1, i.e. the current to drive the sense amplifiers, from exceeding the upper limit set by the reference current level signal. As a result, the peak value of the current flowing to the transistor TR1 can be limited to be lower than the upper limit $I_{max}$ ((e) of FIG. 3), thereby preventing the noise generation due to a rise in the ground potential and also a decrease in the sensing sensitivity of the NMOS sense amplifiers 101 connected to the sense amplifier driving section 1. Since the potential difference between the source and drain of the transistor TR1 (i.e., the potential difference between the common source line 102 and the ground) becomes smaller, the amount of the driving current gradually decreases as shown in (e) of FIG. 3.

Figure 4:
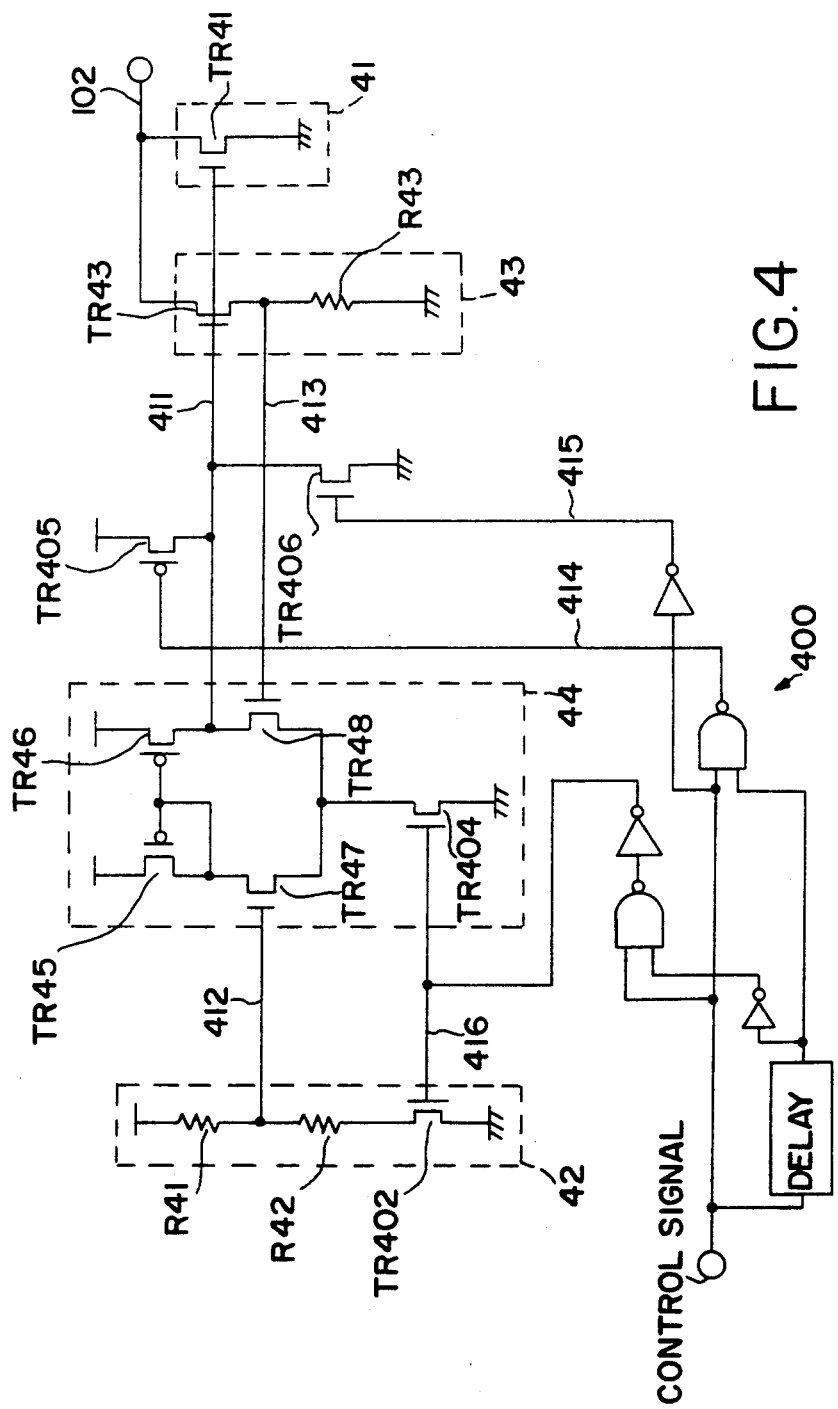
FIG. 4 is a circuit diagram illustrating a second embodiment.

FIG. 4 shows a second embodiment of the invention. This embodiment comprises a sense amplifier driving section 41 having a transistor TR41, a sense amplifier driving current level detection section 43 having a transistor TR43 and a resistor R43, a comparison section 44 having transistors TR45–TR48 and TR404, and a reference current level generating section 42 having resistors R41 and R42 and a transistor TR402. The gates of the transistors TR41 and TR43 are both connected via a control signal line 411 to the connecting point between the transistors TR46 and TR48. The gate of the transistor TR48 is connected via a sense amplifier driving current level signal line 413 to the connecting point between the transistor TR43 and the resistor R43. Further, the gate of the transistor TR47 is connected via a reference current level signal line 412 to the connecting point between the resistors R41 and R42.

This embodiment further comprises an operation period setting circuit 400 for setting the operation period of the reference current level generating section 42 and comparison section 44. This operation period setting circuit 400 has a delay circuit, a AND gate, and an inverter. A line 416 output from the operation period setting circuit is connected to the gate of the transistor TR402 in the reference current level generating section 42 and also to the gate of the transistor TR404 in the comparison section 44. Another output line 414 of the operation period setting circuit is connected to the gate of a transistor TR405 which is connected between the control signal line 411 and the power supply. Furthermore, a further output line 415 of the operation period setting circuit is connected to the gate of a transistor TR406 which is connected between the control signal line 411 and the ground.

Figure 5:
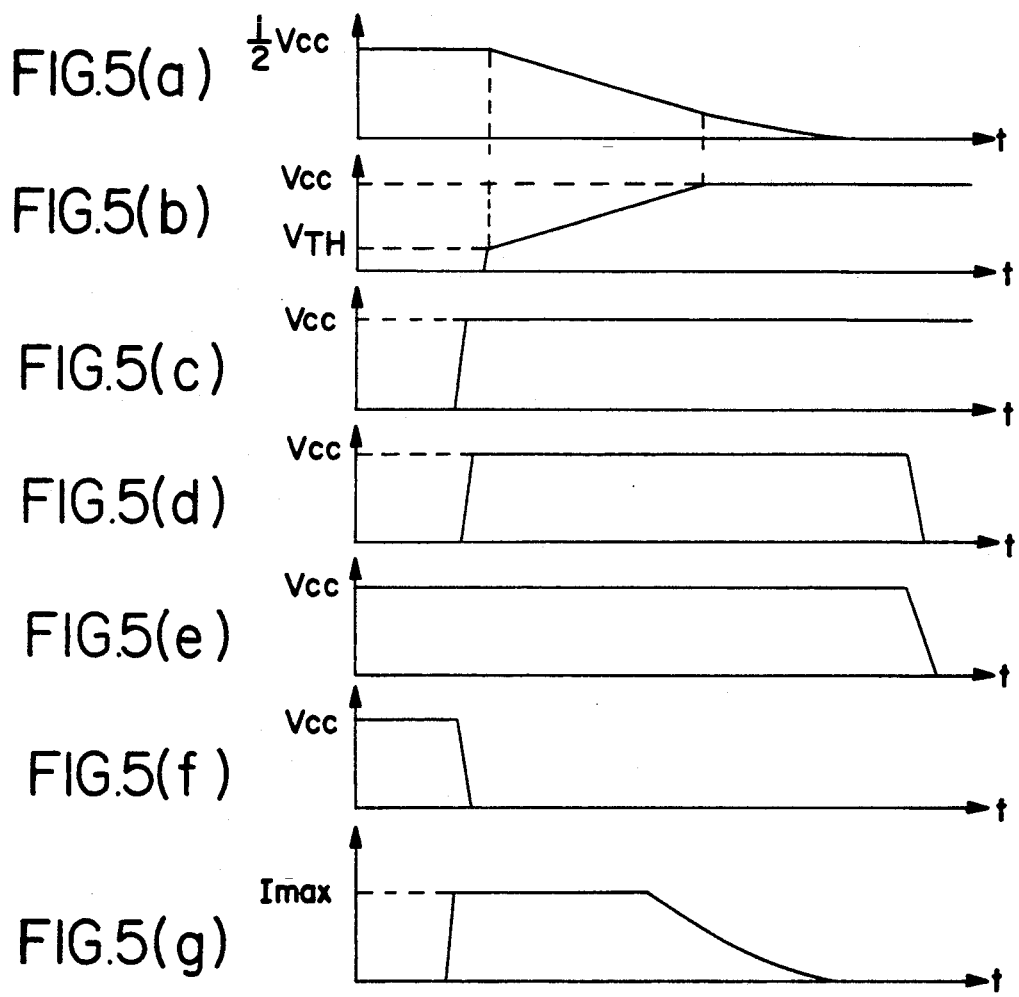
FIG. 5 is a timing chart illustrating the operation of the second embodiment.

In the above configuration, the comparison section 44 controls the potential at the control signal line 411 so that the potential at the sense amplifier driving current level signal line 413 will not exceed the potential determined by the potential at the reference current level signal line 412. That is, in the comparison section 44, the sense amplifier driving current level signal which is supplied from the sense amplifier driving current level detection section 43 and represents the current level proportional to the amount of the current flowing through the sense amplifier driving section 41 is compared with the reference current level signal supplied from the reference current level generating section 42 and setting the upper limit of the current flowing through the sense amplifier driving section 41. Based on the result of this comparison, the comparison section 44 outputs a signal that is input to the gate of the transistor TR41 so as to prevent the amount of current flowing through the transistor TR41 from exceeding the upper limit $I_{max}$ set by the reference current level signal. As a result, the peak current flowing through the sense amplifier driving transistor TR41 can be limited to be lower than the upper limit $I_{max}$, preventing not only noise generation due to a rise in the ground potential but also a decrease in the sensing sensitivity of the NMOS sense amplifiers connected to the sense amplifier driving transistor TR41. Furthermore, as shown in FIG. 5, in this embodiment, the operation period setting circuit 400 controls the potential at the line 416 and thereby limits the operation period of the reference current level generating section 42 and comparison section 44 within a fixed period after the initiation of the sense operations of the NMOS sense amplifiers. This serves to reduce the current consumption of the reference current level generating section 42 and comparison section 44, thus achieving a reduction in power consumption.

Figure 6:
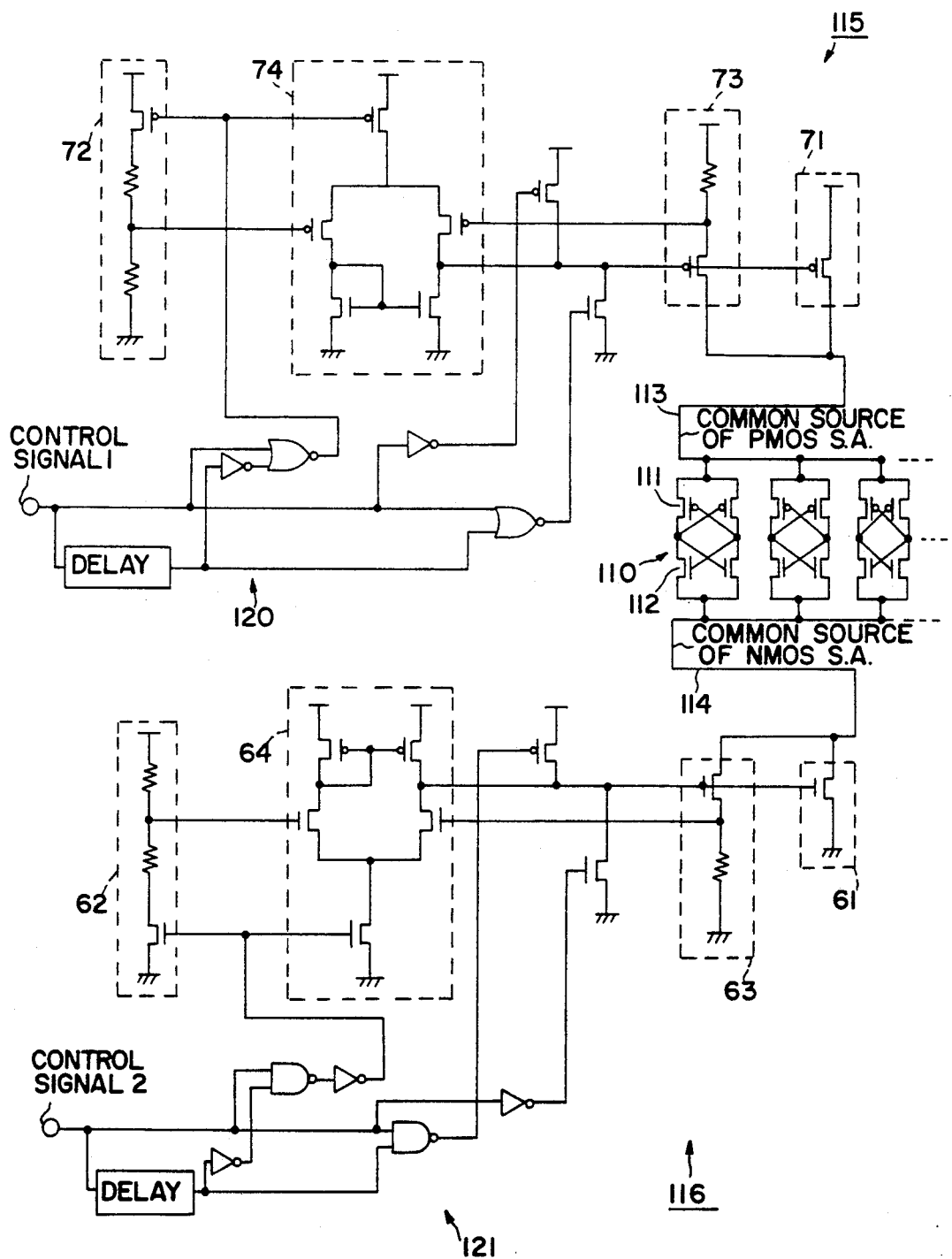
FIG. 6 is a circuit diagram illustrating a third embodiment.
Figure 7:
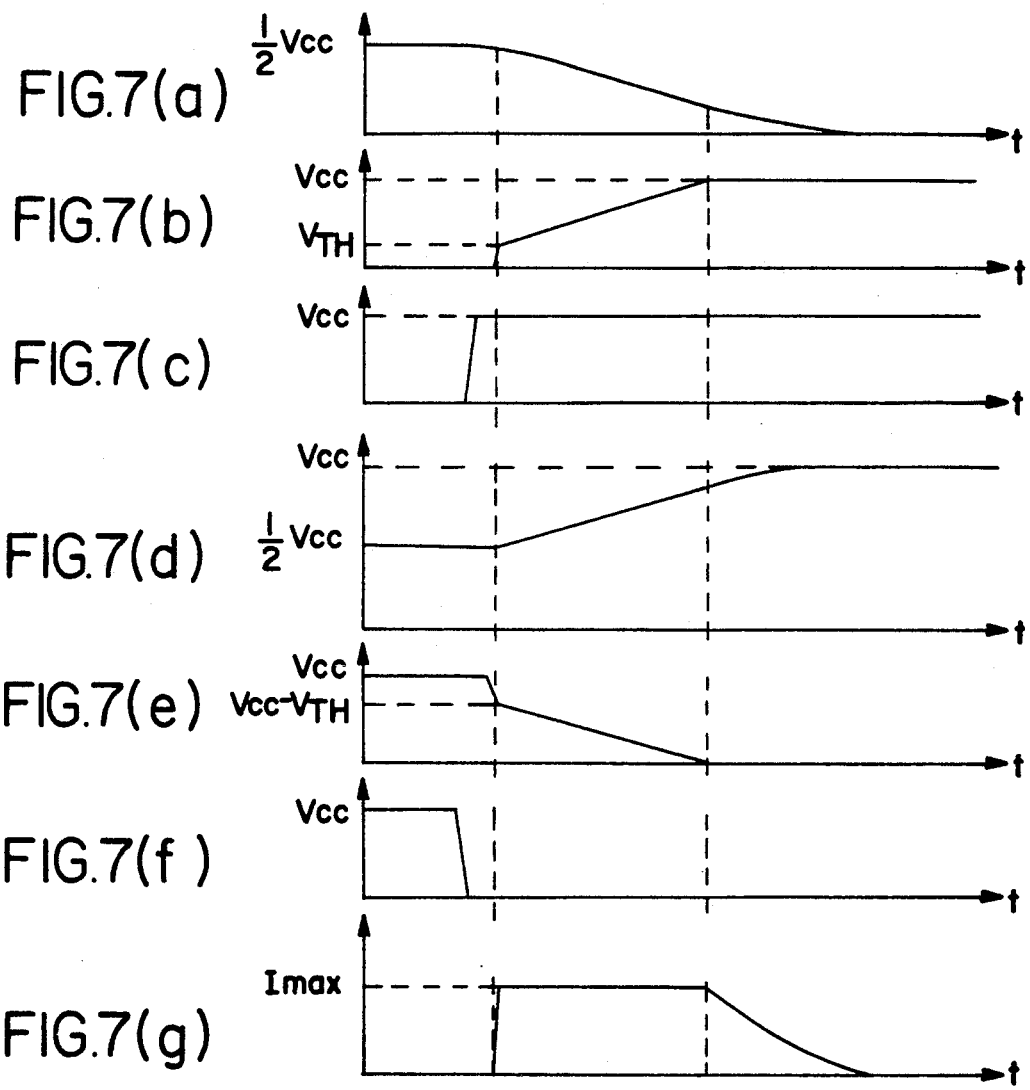
FIG. 7 is a timing chart illustrating the operation of the third embodiment.

A third embodiment of the invention is shown in FIG. 6. This embodiment comprises: CMOS sense amplifiers 110 each consisting of a PMOS sense amplifier 111 and an NMOS sense amplifier 112; a PMOS sense amplifier driving circuit 115 that is connected to a common source line 113 of PMOS sense amplifiers 111 to drive the PMOS sense amplifiers; and an NMOS sense amplifier driving circuit 116 that is connected to a common source line 114 of the NMOS sense amplifiers 112 to drive the NMOS sense amplifiers. The PMOS sense amplifier driving circuit 115 comprises a sense amplifier driving section 71, a sense amplifier driving current level detection section 73, a comparing section 74, a reference current level generating section 72, and an operation period setting circuit 120 having a delay circuit. On the other hand, the NMOS sense amplifier driving circuit 116 comprises a sense amplifier driving transistor 61, a sense amplifier driving current level detection section 63, a comparing section 64, a reference current level generating section 62, and an operation period setting circuit 121 having a delay circuit. The present invention can be applied to a semiconductor memory device having PMOS sense amplifiers. In this embodiment, the peak current can be limited at the start of the sense operations both of the NMOS sense amplifiers 112 and of the PMOS sense amplifiers 111. Therefore, there is no need to stagger the timings of starting the sense operations of the NMOS sense amplifiers 112 and the PMOS sense amplifiers 111. That is, the sense operations both of the NMOS sense amplifiers 112 and PMOS sense amplifiers 111 can be started at the same time, enabling the sense operations of the sense amplifiers 110 each consisting of the NMOS and PMOS sense amplifiers to be completed in a short period of time. FIG. 7 illustrates the operation of the embodiment.

In the above-described embodiments, the sense amplifier driving section uses a MOS transistor. Alternatively, a bipolar transistor may be used in the sense amplifier driving section. In this case, the base of the bipolar transistor is used as the control terminal. In the embodiments shown in FIGS. 4 and 6, the two input signals compared by the comparing section may be balanced or unbalanced.

Figure 8:
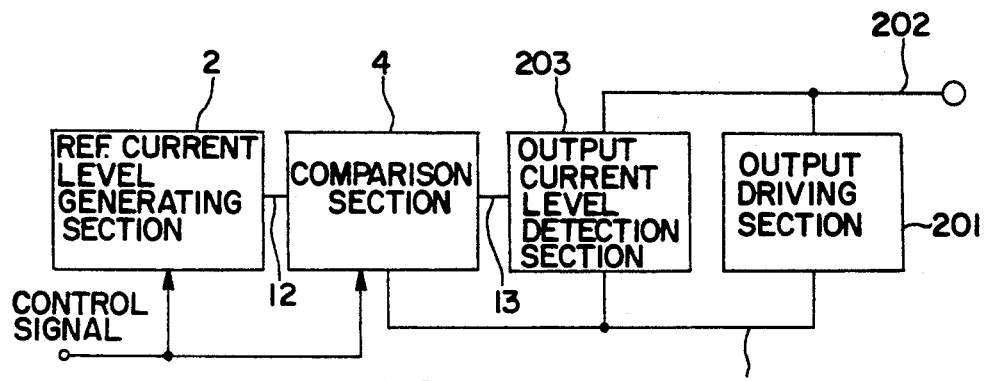
FIG. 8 is a block diagram illustrating a fourth embodiment of the invention.

FIG. 8 diagrammatically shows a semiconductor device which is a fourth embodiment of the invention.

Figure 9:
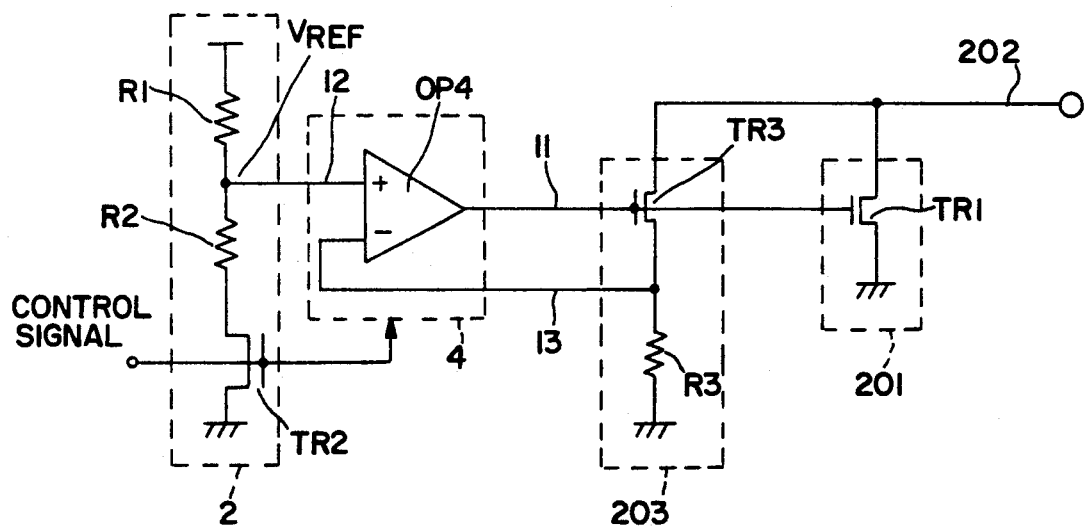
FIG. 9 is a circuit diagram illustrating the fourth embodiment.
Figure 10A:
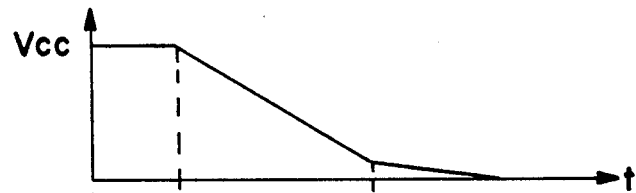
FIG. 10 is a timing chart illustrating the operation of the fourth embodiment.
Figure 10B:
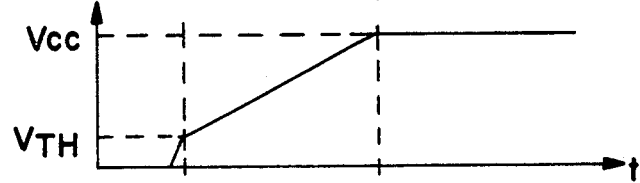
Figure 10C:
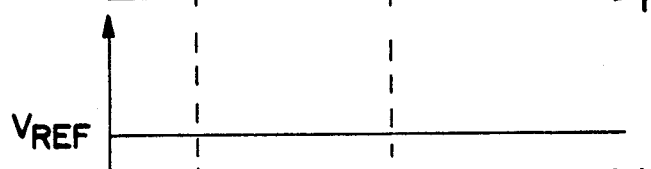
Figure 10D:
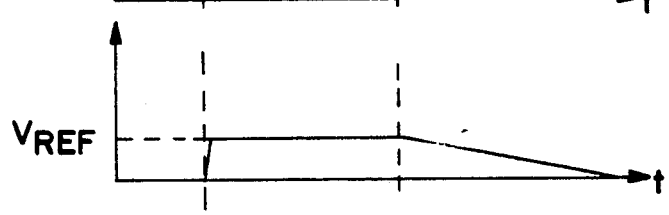
Figure 10E:
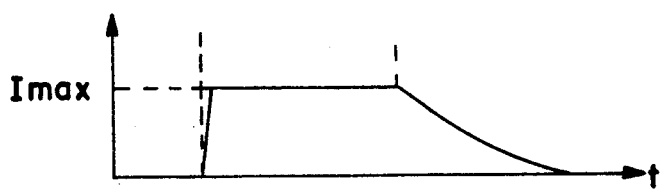

FIG. 9 illustrates the circuit configuration of this semiconductor device having the same structure as that of the embodiment of FIG. 1 except that an output driving section 201 and an output current level detection section 203 are connected to an output line 202 of an output circuit (not shown) of this device. In this embodiment, the control signal is the one instructing the pull-down of the output line 202. The output driving section 201 and output current level detection section 203 respectively correspond to the sense amplifier driving section 1 and sense amplifier driving current level detection section 3, and have the same structure as those of these sections. FIG. 10 illustrates the operation of this embodiment. This embodiment operates in a similar manner as the embodiment of FIG. 1, and therefore the peak value of the current flowing to the output driving section 201 can be limited to be lower than the upper limit $I_{max}$ ((e) of FIG. 10), thereby preventing the noise generation due to a rise in the ground potential.

Figure 11:
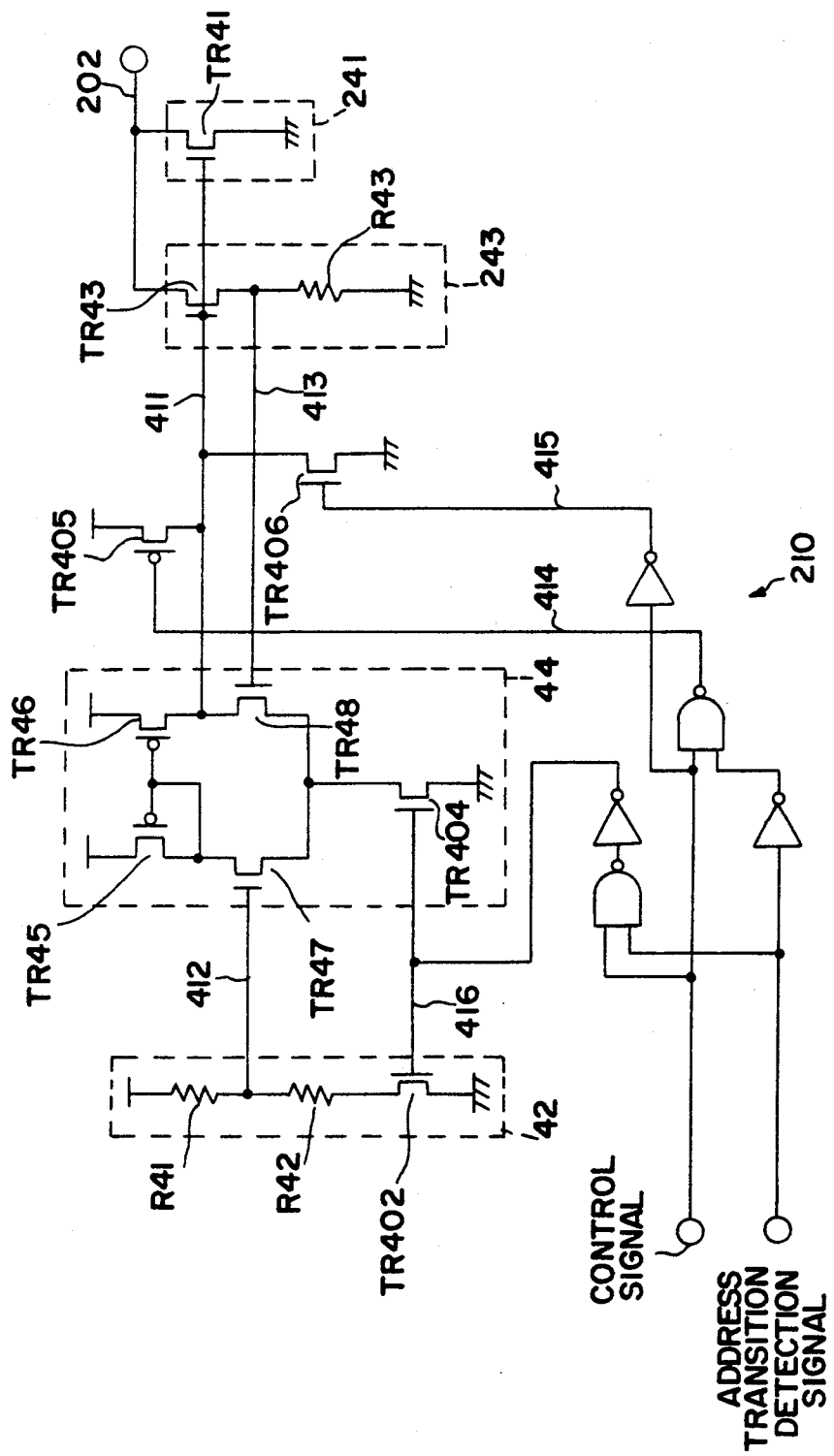
FIG. 11 is a circuit diagram illustrating a fifth embodiment.
Figure 12A:
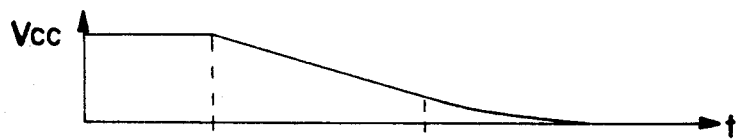
FIG. 12 is a timing chart illustrating the operation of the fifth embodiment.
Figure 12B:
Figure 12C:
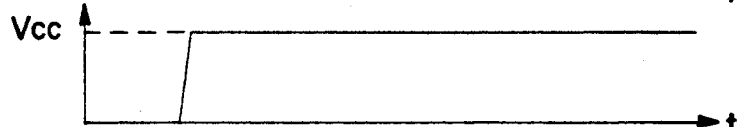
Figure 12D:
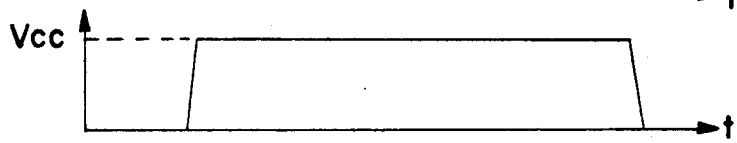
Figure 12E:
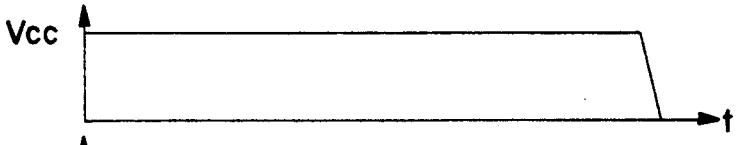
Figure 12F:
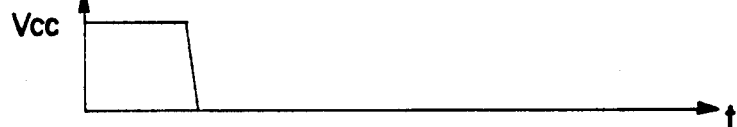
Figure 12G:
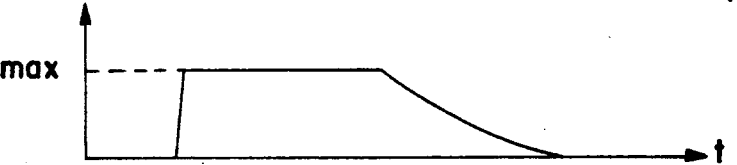

FIG. 11 shows a further embodiment of the invention. This embodiment has a similar structure as the embodiment of FIG. 4, but an output driving section 241 and an output current level detection section 243 are provided instead of the sense amplifier driving section 41 and sense amplifier driving current level detection section 43. In this embodiment, the delay circuit is not provided, and an address transition detection signal is supplied to an operation period setting circuit 210. As seen from FIG. 12, the operation period setting circuit 210 controls the operation period of the reference current level generating section 42 and comparison section 44 within a fixed period including the time of receiving the control signal. This serves to reduce the current consumption of the reference current level generating section 42 and comparison section 44, thus achieving a reduction in power consumption.

Figure 13:
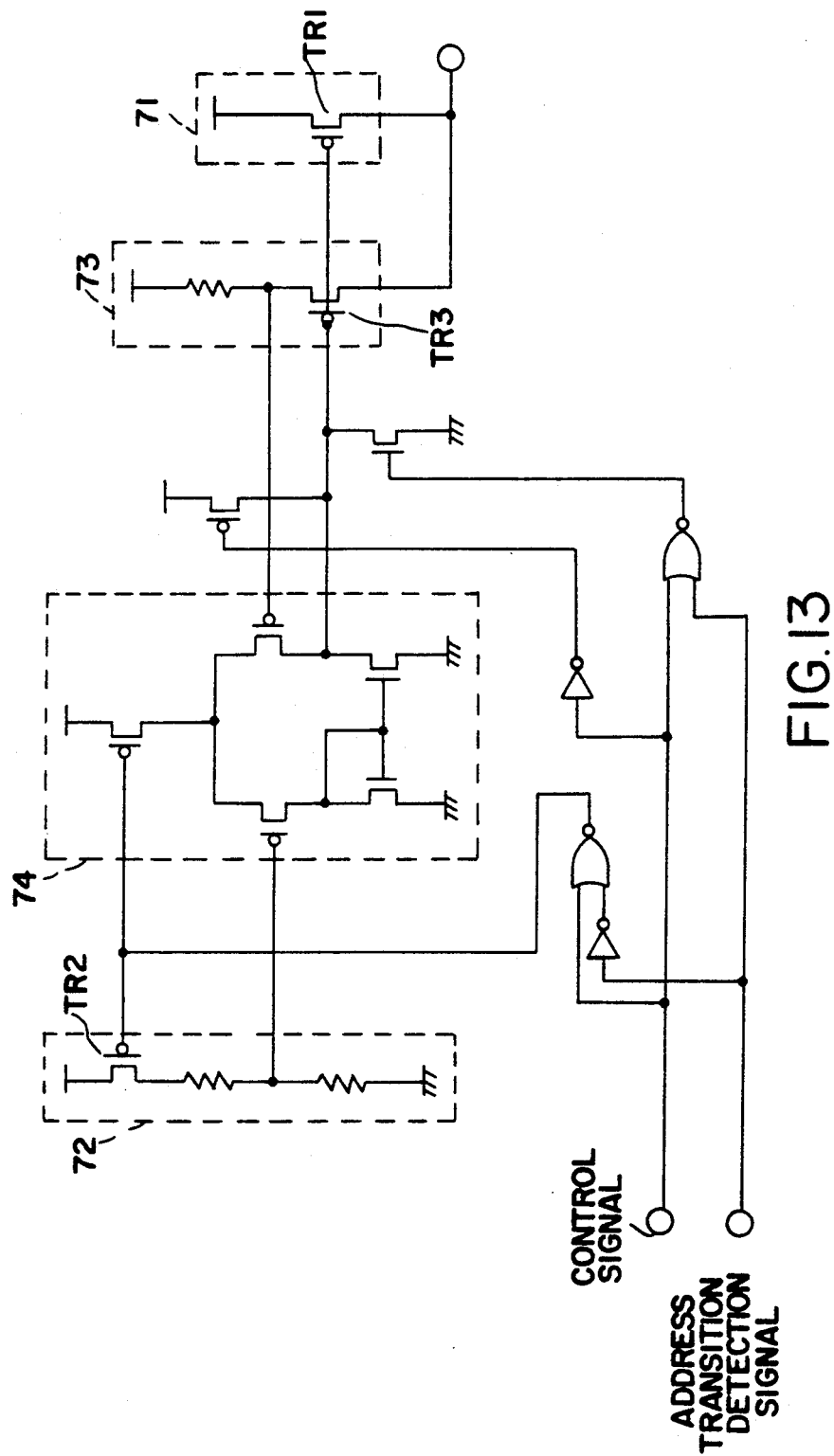
FIG. 13 is a circuit diagram illustrating a sixth embodiment.
Figure 14A:
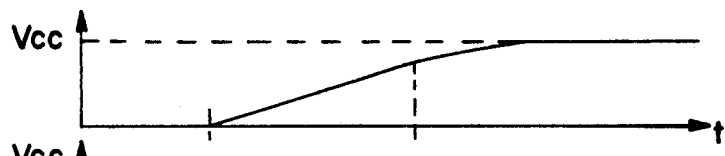
FIG. 14 is a timing chart illustrating the operation of the sixth embodiment.
Figure 14B:
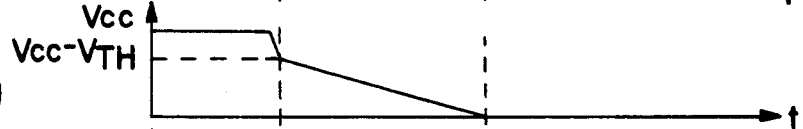
Figure 14C:
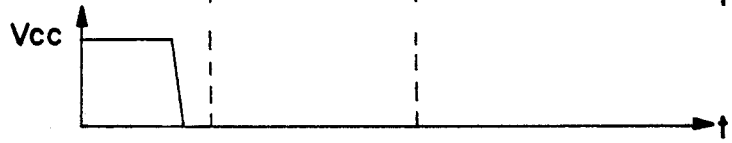

A sixth embodiment of the invention is shown in FIG. 13. The embodiment comprises an output driving section 71, an output current level detection section 73, a comparing section 74, and a reference current level generating section 72. In this embodiment, PMOS transistors are used instead of some of the NMOS transistors used in the embodiment of FIG. 11. For example, transistors TR1, TR2 and TR3 respectively used in the output driving section 71, reference current level generating section 72 and output current level detection section 73 are NMOS transistors. As seen from above, this invention can be also applicable to a semiconductor device in which an output line is to be pulled up. FIG. 14 illustrates the operation.

Figure 15:
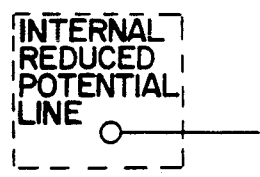
FIGS. 15 to 17 show examples of the reference current level generating means used in the invention.
Figure 17:
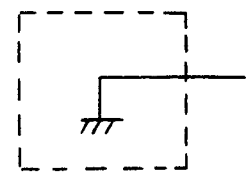
Figure 16:
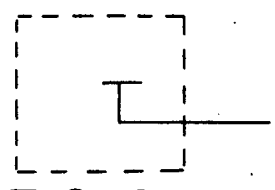

In the above-described embodiments, the reference current level generating section extracts a reference current level signal by dividing the supply voltage through resistors, but the construction of the reference current level signal generating means is not limited to the resistive divider type and any means that can generate an appropriate reference current level may be used. FIGS. 15, 16 and 17 show examples of the reference current level generating section.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents

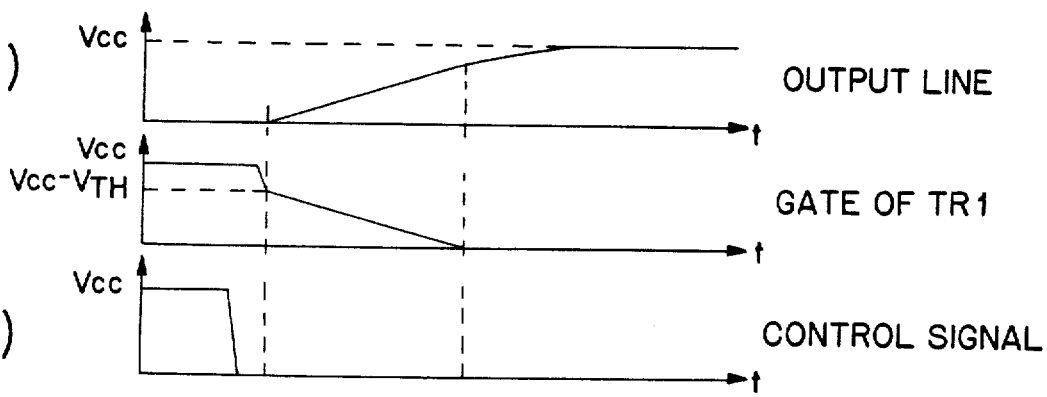

What is claimed is:

1. In a semiconductor device comprising pulling means for receiving a control signal, and for pulling a voltage level of a line of said semiconductor device toward a predetermined level in accordance with said control signal, said semiconductor device further comprises: generating a current level signal generation means for generating a current level signal indicative of a level of a current which flows through said pulling means, said current signal generating means being connected to said line of said semiconductor device;

reference level signal generation means for generating a reference level signal indicative of an allowable maximum level of the current which flows through said pulling means; and comparison means for receiving said current level signal and said reference level signal, and for comparing said current level signal with said reference level signal, and for adjusting said control signal so as to prevent said current level signal from exceeding said reference level signal.

2. A semiconductor device according to claim 1, wherein said semiconductor device is a semiconductor memory device having a plurality of sense amplifiers, and said line is a common source line of said sense amplifiers.

3. A semiconductor device according to claim 1, wherein said line is a line connected to an output of said semiconductor device.

4. A semiconductor device according to claim 1, wherein said semiconductor device further comprises operation period control means for controlling the operation period of at least one of said reference level signal generation means and comparison means.

5. A semiconductor device according to claim 1, wherein said pulling means is a pull-down transistor.

6. A semiconductor device according to claim 1, wherein said pulling means is a pull-up transistor.

7. A semiconductor device according to claim 1, wherein said pulling means and said current level signal generation means are connected in parallel with said line of the semiconductor device, each of said pulling means and said current level signal generation means includes transistor means for controlling a level of a current which flows through said transistor means in accordance with said control signal.

8. A semiconductor device according to claim 7, wherein said current level signal generation means includes resistor means, said resistor means reducing said level of said current which flows through said transistor means.

9. A semiconductor device according to claim 7, wherein said current level signal generation means includes resistor means connected to said transistor means in series.

* * * * *

UNITED STATES PATENT AND TRADEMARK OFFICE
CERTIFICATE OF CORRECTION

PATENT NO. : 5,175,451

DATED : December 29, 1992

INVENTOR(S) : Ihara et al

Page 1 of 7

It is certified that error appears in the above-indentified patent and that said Letters Patent is hereby corrected as shown below:

In the drawings, sheets 2, 4, 6, 8, 10 and 12, consisting of Figs. 3(a)-3(e); 5(a)-5(g); 7(a)-7(g); 10(a)-10(e); 12(a)-12(g); and 14(a)-14(c), should be deleted to be replaced with the corrected Figs. as shown on the attached pages.

Signed and Sealed this

Fifth Day of July, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,175,451
DATED : December 29, 1992
INVENTOR(S) : Makoto Ihara

Page 2 of 7

It is certified that error appears in the above-indentified patent and that said Letters Patent is hereby corrected as shown below:

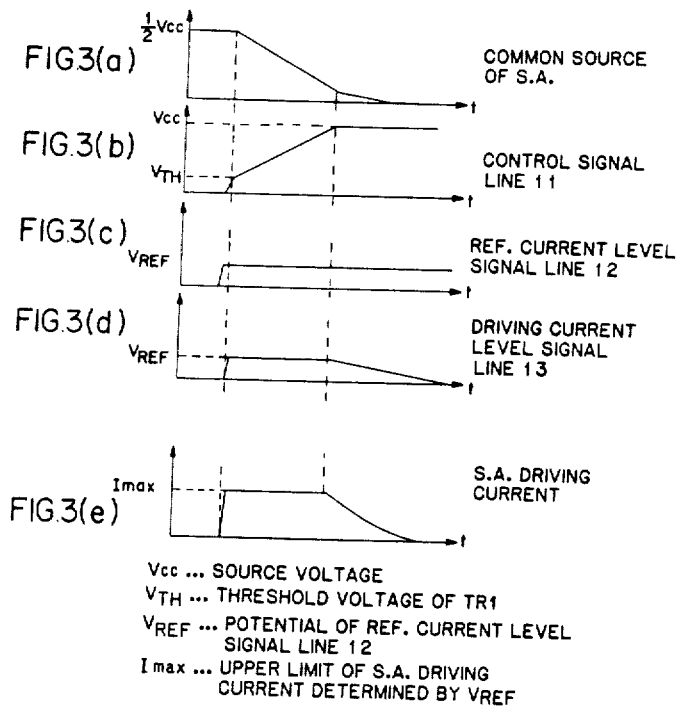

UNITED STATES PATENT AND TRADEMARK OFFICE
CERTIFICATE OF CORRECTION

PATENT NO. : 5,175,451
DATED : 29 December 1992
INVENTOR(S) : Makoto Ihara

It is certified that error appears in the above-identified patent and that said Letters Patent is hereby corrected as shown below:

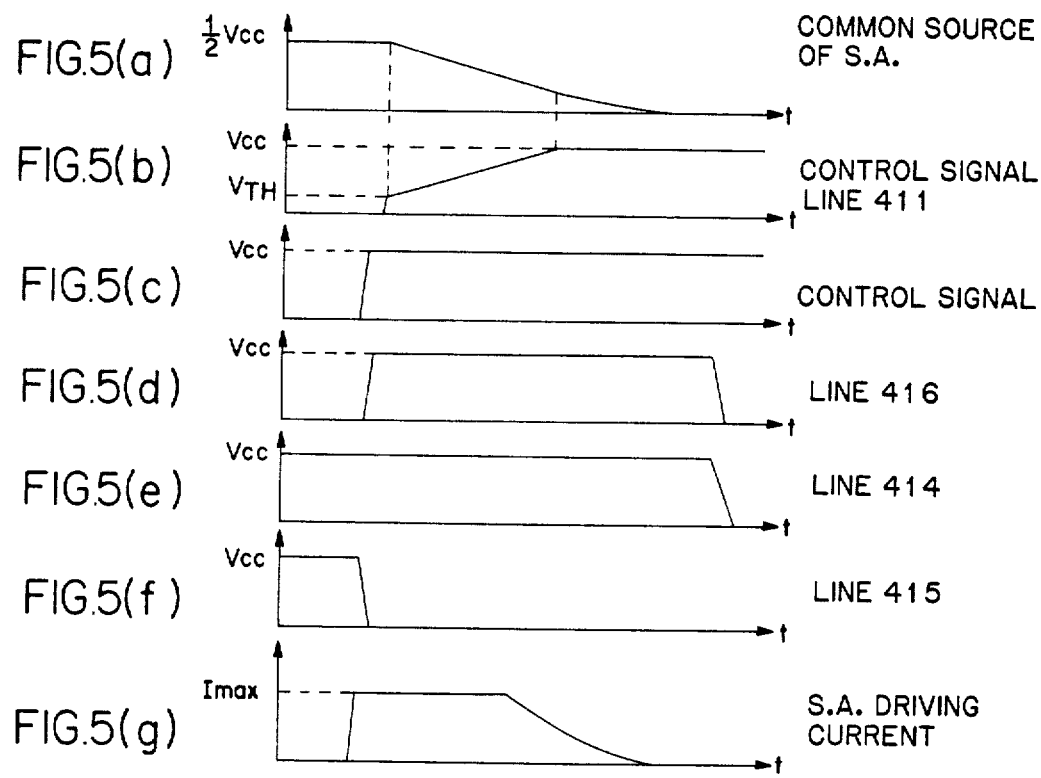

UNITED STATES PATENT AND TRADEMARK OFFICE
CERTIFICATE OF CORRECTION

PATENT NO. : 5,175,451
DATED : 29 December 1992
INVENTOR(S) : Makoto Ihara

It is certified that error appears in the above-identified patent and that said Letters Patent is hereby corrected as shown below:

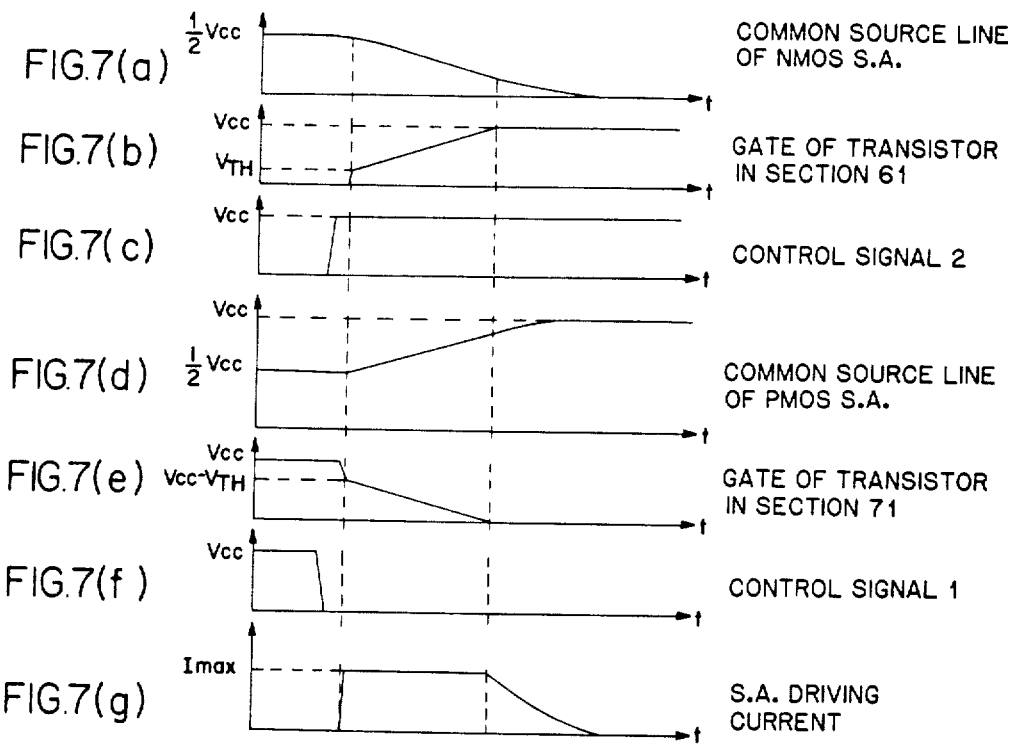

UNITED STATES PATENT AND TRADEMARK OFFICE
CERTIFICATE OF CORRECTION

PATENT NO. : 5,175,451
DATED : 29 December 1992
INVENTOR(S) : Makoto Ihara

It is certified that error appears in the above-identified patent and that said Letters Patent is hereby corrected as shown below:

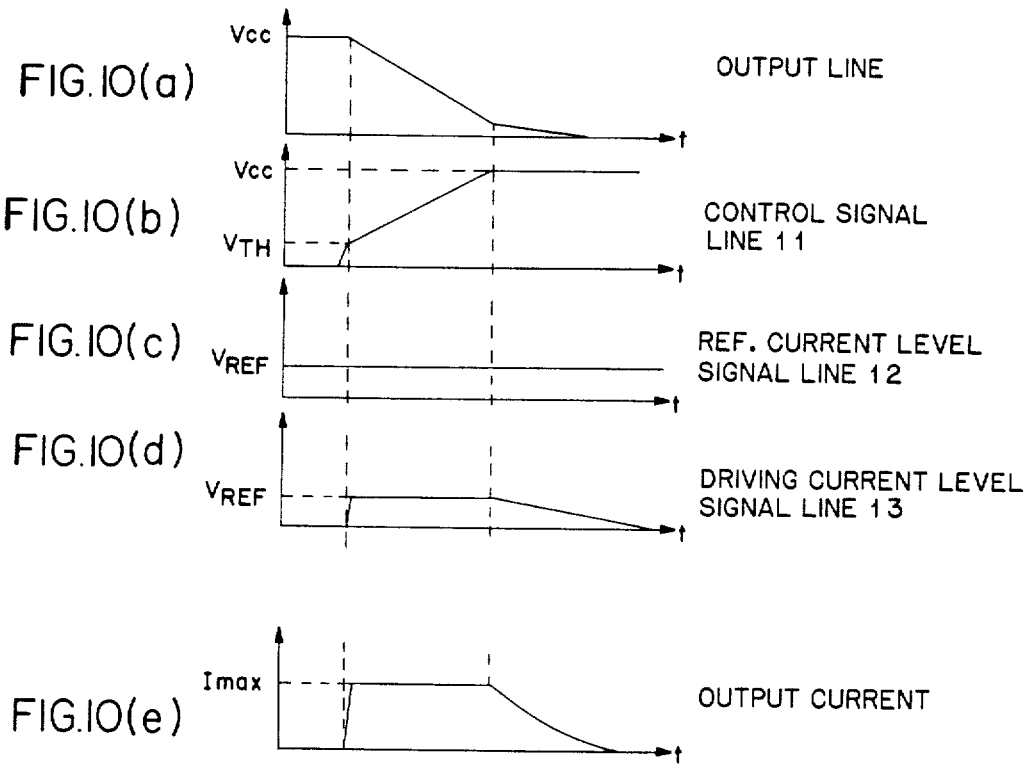

UNITED STATES PATENT AND TRADEMARK OFFICE
CERTIFICATE OF CORRECTION

PATENT NO. : 5,175,451
DATED : 29 December 1992
INVENTOR(S) : Makoto Ihara

It is certified that error appears in the above-identified patent and that said Letters Patent is hereby corrected as shown below:

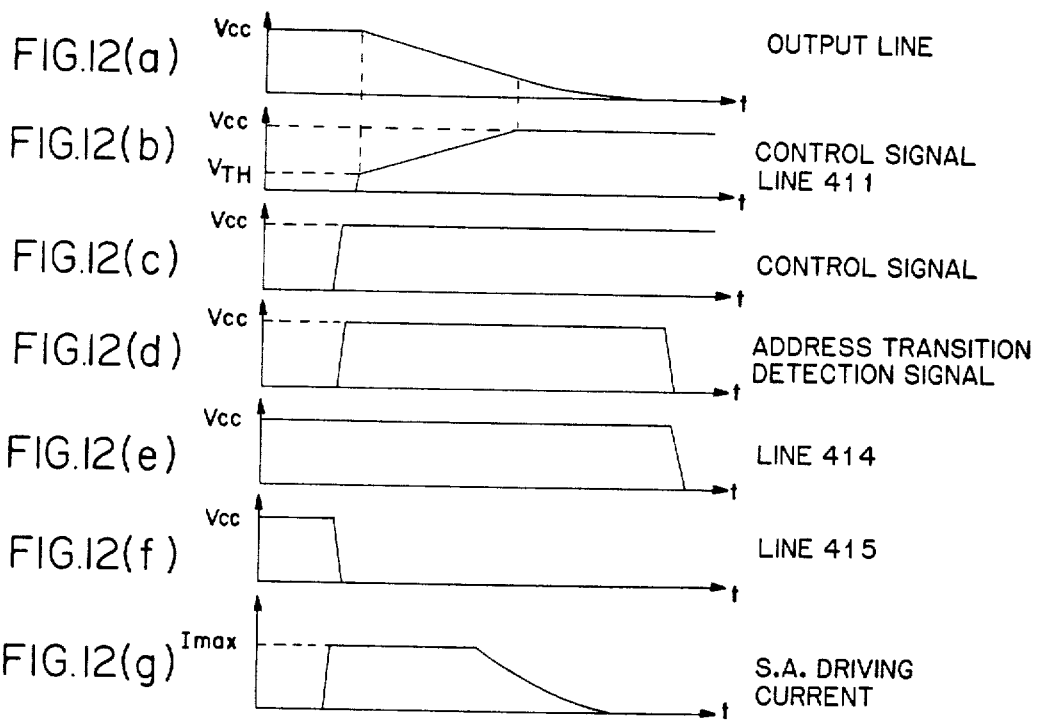

UNITED STATES PATENT AND TRADEMARK OFFICE
CERTIFICATE OF CORRECTION

PATENT NO. : 5,175,451
DATED : 29 December 1992
INVENTOR(S) : Makoto Ihara

It is certified that error appears in the above-identified patent and that said Letters Patent is hereby corrected as shown below: